United States Patent

[11] 3,594,653

[72] Inventor James J. Tomczak
Burlington, Vt.
[21] Appl. No. 889,384
[22] Filed Dec. 31, 1969
[45] Patented July 20, 1971
[73] Assignee International Business Machines Corporation
Armonk, N.Y.

[54] CROSS-COUPLED DIFFERENTIAL AMPLIFIER
9 Claims, 1 Drawing Fig.

[52] U.S. Cl. .................................................. 330/30 D, 330/30 R, 330/69
[51] Int. Cl. .................................................. H03f 3/68
[50] Field of Search .................................................. 330/30, 30 D, 69

[56] References Cited
UNITED STATES PATENTS

| | | | |
|---|---|---|---|
| 3,454,893 | 7/1969 | Goordman .................. | 330/30 |
| 3,530,391 | 9/1970 | Goordman .................. | 330/30 X |

*Primary Examiner*—Roy Lake
*Assistant Examiner*—Lawrence J. Dahl
*Attorney*—Sughrue, Rothwell, Mion, Zinn & Macpeak

ABSTRACT: A monolithic cross-coupled differential amplifier circuit for amplifying a bipolar input signal having a low signal-to-noise ratio. The differential amplifier circuit comprises two transistor differential amplifiers having cross-coupled inputs and a common output. Both amplifiers are normally biased on so that all differential mode and common mode input signals are normally rejected. Means is provided for cutting off one of the differential amplifiers when a differential or bipolar information signal appears at the input of the circuit, thereby permitting the other differential amplifier to provide at the common output an amplified version of the input signal. By selectively controlling which of the differential amplifiers is cutoff, the polarity of the differential output signal is made independent of the polarity of the input signal.

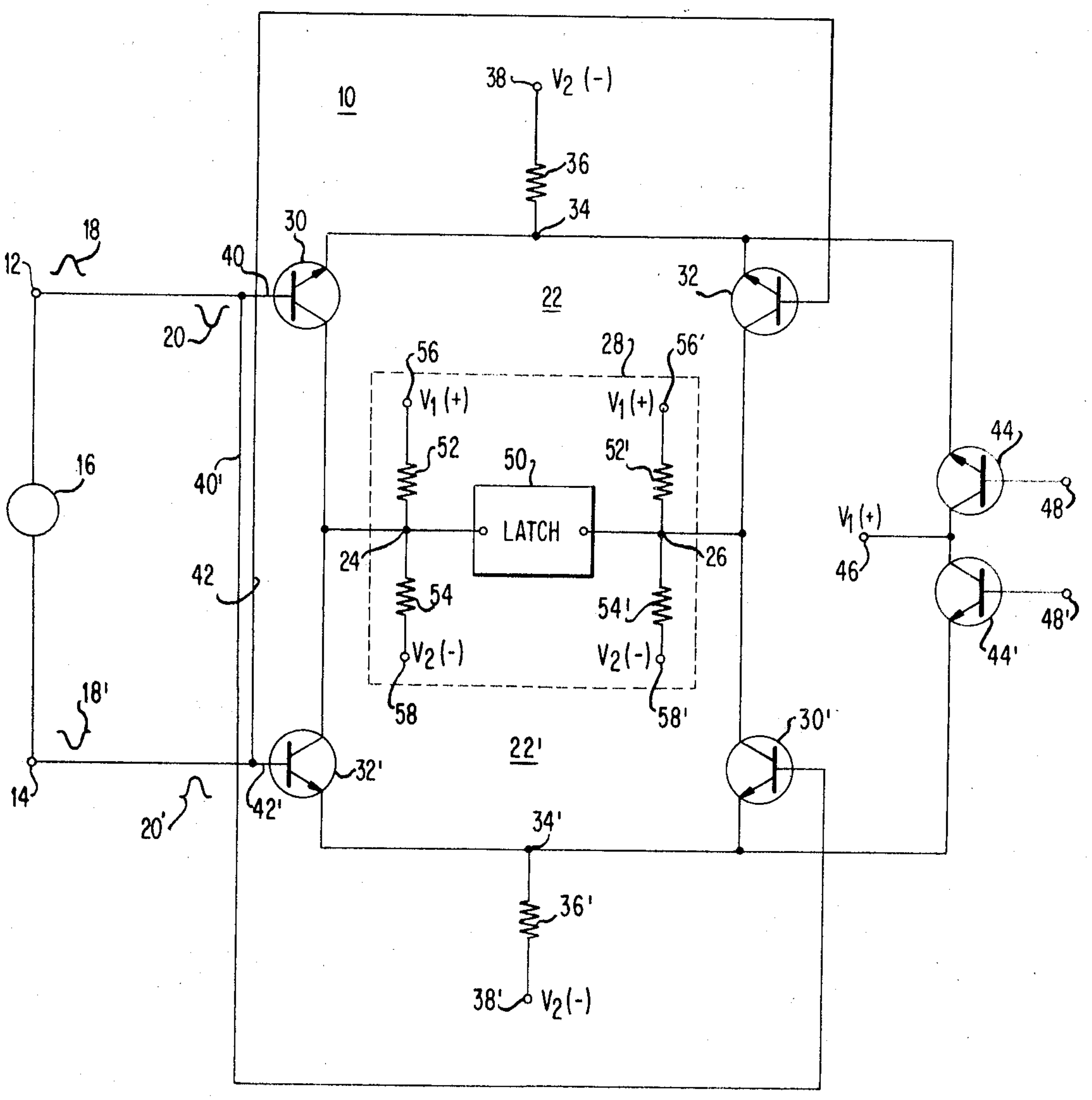
INVENTOR
JAMES J. TOMCZAK
BY Sughrue, Rothwell, Mion, Zinn & Macpeak
ATTORNEYS

CROSS-COUPLED DIFFERENTIAL AMPLIFIER

CROSS-REFERENCES TO RELATED APPLICATIONS

The following copending applications are assigned to the assignee of the present application and disclose utilization means of the type which is adapted to be connected to the output of the differential amplifier circuit disclosed and claimed in the present application:

Latch Circuit—Tomczak filed Dec. 31, 1969 having Ser. No. 889,383, filed concurrently with the present application.

Sensing Circuit —Norton et al. filed Jan. 10, 1969, having Ser. No. 790,247.

BACKGROUND OF THE INVENTION

1. Field of the Invention

The field of the invention is differential amplifiers, and more particularly, a monolithic transistor differential amplifier circuit having cross-coupled inputs to provide high noise rejection.

2. Description of the Prior Art

A problem in the prior art is the detection of bipolar signals having a very low signal-to-noise ratio. Such signals occur in sense lines used for reading out information stored in thin magnetic films or magnetic cores used in computer memories.

One solution to this problem has been to apply the bipolar sense signals to a single differential amplifier which is normally nonconductive and is rendered conducting only during the time when an input signal is expected. However, it has been found that large noise signals often have sufficient amplitude to turn on the differential amplifier thereby providing a false output signal. Furthermore, since a differential amplifier is normally off, an undesirably long time is required after the transistor is initially turned on to permit it to reach its full gain.

Another defect of such a prior art differential amplifier is that the polarity of the differential output thereof is dependent upon the polarity of the bipolar or differential input signal applied to the amplifier.

SUMMARY OF THE INVENTION

Therefore, the primary object of the present invention is to provide an improved differential amplifier circuit which has a very much improved noise rejection feature which permits the circuit to reject much higher noise signals than was possible in the prior art.

Another object of the invention is to provide an improved differential amplifier circuit which does not require turn-on time to amplify an input data signal.

Another object of the invention is to provide an improved differential amplifier circuit which provides a differential output signal whose polarity is independent of the polarity of a bipolar or differential input signal.

Another object is to provide an improved differential amplifier circuit of the monolithic type.

The invention may be summarized as an improved differential amplifier circuit comprising two differential amplifiers having cross-coupled inputs and a common output. The circuit is normally biased so that both amplifiers are conducting, in which case all input signals are rejected by the circuit. When an input signal is expected to occur, one of the differential amplifiers is cutoff so that this input signal is amplified by the other amplifier which remains conducting. An additional feature of the invention is the provision of means for selectively cutting off either of the differential amplifiers so that the polarity of the differential output signal is independent of the polarity of the input signal.

BRIEF DESCRIPTION OF THE DRAWING

The single FIGURE is a schematic diagram of a preferred form of an improved cross-coupled differential amplifier circuit embodying the invention.

DESCRIPTION OF THE PREFERRED EMBODIMENT

The figure is a schematic diagram illustrating a preferred embodiment of the improved differential amplifier circuit of the invention.

The differential amplifier circuit 10 has a pair of input terminals 12 and 14 for receiving bipolar input signals. These signals may be supplied by any bipolar signal source 16 connected to the cross terminals 12 nd 14. The source 16 may be, for example, a sense line associated with a magnetic film memory or with a row of cores in one plane of a magnetic core memory. Source 16 functions to provide bipolar input pulses, such as pulses 18 and 18′ of the same magnitude but of opposite polarity or input pulses 20 and 20′ of the same magnitude but of opposite polarity.

Input terminals 12 and 14 are connected in a cross-coupled fashion to the inputs of two differential amplifiers 22 and 22′ both of which are normally conducting or turned on. The differential amplifiers 22 and 22′ have a pair of common output terminals 24 and 26 which are the output terminals for the differential amplifier circuit 10. A suitable utilization circuit 28 requiring a differential input signal is connected across the output terminals 24 and 26.

The preferred embodiment of the invention is illustrated as a monolithic transistor differential amplifier circuit, but it is to be understood that the circuit may comprise conventional discrete transistors and components and, furthermore, that the active elements need not be transistors, but may be other electronic valves or amplifiers such as vacuum tubes.

As the figure illustrates, the differential amplifier circuit 10 is completely symmetrical in that the transistors forming the two differential amplifiers 22 and 22′ are matched and that corresponding resistors and bias voltages for both amplifiers are identical.

Differential amplifier 22 comprises NPN transistors 30 and 32 having their emitters coupled to a common point 34 which is connected through a common emitter resistor 36 to a biasing terminal 38 to which a negative voltage $V_2$ is applied. Terminal 12 is connected via a lead 40 to the base of transistor 30, and input terminal 14 is connected via a lead 42 to the base of transistor 32. Similarly, differential amplifier 22′ comprises a pair of NPN transistors 30′ and 32′ having their emitters connected to a common point 34′ which is connected through a common emitter resistor 36′ to a biasing terminal 38′ to which the same negative potential $V_2$ is applied. Input terminal 12 is connected via a lead 40′ to the base of transistor 30′, and input terminal 14 is connected via a lead 42′ to the base of transistor 32′. It can be seen that the connections made by leads 40, 40′ and 42, 42′ cross-couple the inputs of the two differential amplifiers 22 and 22′ to the input terminals 12 and 14.

Connected to the common emitter point 34 of transistors 30 and 32 is an NPN switching transistor 44 having its emitter connected to the common point 34 and its collector connected to a biasing terminal 46 to which is applied a positive biasing potential $V_1$. The base of transistor 44 is connected to a control terminal 48 which receives suitable gating or strobing signals for turning on transistor 44 which is normally off. Similarly, a transistor 44′, which is matched to transistor 44, has its emitter connected to the common point 34′ of differential amplifier 22′. Its collector is also connected to the biasing terminal 46. Furthermore, its base is connected to a control terminal 48′ for receiving suitable gating or strobing signals for turning transistor 44′ on, this transistor normally being off.

As mentioned above, the transistors 30, 30′, 32 and 32′ are all matched, that is, the base-to-emitter voltages ($V_{be}$) of the transistors are all matched. Furthermore, resistors 36 and 36′ have the same value. In one application of the circuit, the data signals from the sense line of a thin film memory range in magnitude from 1 millivolt to about 60 millivolts in both polarities, whereas the noise ranges from 1 to 1 1/2 volts in both polarities. The values of the resistors 36 and 36′ were 1.1K, the value of $V_1$ was + 1.2 volts and the value of $V_2$ was −3 volts. The gain of each differential amplifier was 3.

The utilization device 28 may comprise a bipolar data pulse threshold detection circuit comprising a latch 50 which is designed to set when a differential output of one polarity exceeds a certain predetermined threshold value. The latch may comprise, for example, a pair of transistors, the first one of which is conducting and the second one of which is nonconducting for the set state of the latch, with the second one being conducting and the first being nonconducting for the reset state of the latch. Such a latch is described and claimed in the copending application Ser. No. 889,383.

In operation, the transistors 44 and 44′ are normally nonconducting so that the differential amplifiers 22 and 22′ are normally conducting. This result is obtained by interaction of the utilization circuit with the differential amplifiers. More specifically, the utilization circuit may contain a voltage divider comprising resistors 52 and 54 connected between bias terminals 56 and 58 to which the bias voltages $V_1$ and $V_2$ are respectively applied. The output terminal 24 is connected to the juncture of these two resistors. Consequently, a current path is formed from bias terminal 56 through output terminal 24 and the collectors, emitters and common emitter resistors of the transistors 30 and 32′ to the negative bias potential $V_2$ applied to the bias terminals 38 and 38′. In like manner, a voltage divider comprising resistors 52′ and 54′, having values equal to the values of resistors 52 and 54, respectively, is connected between bias terminals 56′ and 58′ to which the bias potentials $V_1$ and $V_2$ are respectively applied. Output terminal 26 is connected to the juncture of these resistors. Therefore, another current path is formed from the positive bias terminal 56′ through output terminal 26 and the collectors, emitters and common emitter resistors 36 and 36′ of transistors 32 and 30′ to the negative bias potential $V_2$ applied to the terminals 38 and 38′.

When the differential amplifier circuit 10 is in this condition, i.e. both differential amplifiers 22 and 22′ conducting, a differential output voltage $V_{24} - V_{26}$ appears across the output terminals 24 and 26. However, this differential output voltage will not be changed by any input signal at the terminals 12 or 14. More specifically, neither differential mode or common mode input or noise signals will change the differential output voltage because of the cross-coupling of the inputs of the two differential amplifiers as described above.

More specifically, assuming bipolar or differential mode inputs 18, 18′ appear at the input terminals 12 and 14, transistors 30 and 30′ will both be driven further into conduction and transistors 32 and 32′ will be rendered correspondingly less conducting. Since the transistors are all matched, the net change in the output voltage $V_{24} - V_{26}$ at terminals 24 and 26 will be zero. Furthermore, a single mode signal, such as a noise signal, appearing at input terminal 12 will also have no effect on the output voltage $V_{24} - V_{26}$ since, assuming a positive noise signal, transistors 30 and 30′ will increase their conducting correspondingly thereby providing a net change of zero across the terminals 24 and 26. In like manner, if a negative noise signal appears at terminal 12, both transistors 30 and 30′ will have their currents correspondingly reduced, again resulting in a net change of zero in the differential voltage at the output terminals 24 and 26. The same result will be achieved if a noise signal appears on input terminal 14.

When a differential or bipolar input data signal is expected at input terminals 12 and 14, one of the differential amplifiers 22–22′ is turned off for the duration of the input signal. This result is accomplished by turning on one of the switching transistors 44 or 44′ to apply the positive bias potential $V_1$ appearing at terminal 46 to the common emitter point of one of the differential amplifiers. For example, if there is applied to terminal 48 a positive gating or strobing pulse of sufficient magnitude to drive transistor 44 into saturation, then substantially all of the positive potential $V_1$ will be applied to the common point 34 of the differential amplifier 22, thereby rendering transistors 30 and 32 nonconducting and turning off differential amplifier 22. Amplifier 22′ will then function as a normal differential amplifier and provide across output terminals 24 and 26 a differential output voltage which is an amplified version of the bipolar input signals 18, 18′ or 20, 20′. Assuming the inputs are the bipolar signals 18 and 18′, the transistor 30′ will become more conducting while the transistor 32′ becomes correspondingly less conducting, thereby causing the output terminal 24 to become relatively more positive with respect to output terminal 26 as compared to the normal state of the differential amplifier circuit when both amplifiers 22 and 22′ are conducting. The resulting differential output voltage $V_{24}—V_{26}$ is an amplified version of the bipolar input signals 18, 18′.

It can be seen that the relative polarity of the differential output signal $V_{24}—V_{26}$ at the output terminals 24 and 26 may be rendered independent of the relative polarity of the input signals by selectively turning off one or the other of the differential amplifiers 22 and 22′. For example, assuming that it is desired to maintain output terminal 24 always positive with respect to output terminal 26, if the bipolar input signals 20 and 20′ are present, then switching transistor 44′ is turned on, rather than transistor 44, thereby turning off the differential amplifier 22′. In this case, the input signal 20′ will drive transistor 32 further into conduction while the input signal 20 correspondingly reduces the conduction of transistor 30 so that the voltage of output terminal 24 is increased relative to the voltage at output terminal 26. Also, for either polarity input signal it is clear that the polarity of the output signal appearing across terminals 24 and 26 may be controlled by selectively turning on the correct one of the switching transistors 44 and 44′.

In addition to providing a differential output signal which is independent of the polarity of the input signal, the differential amplifier circuit 10 provides much greater noise rejection than is available with prior art circuits which basically contain a single differential amplifier. The improved differential amplifier circuit of the present invention will reject a much higher level of noise than is possible with the prior art circuit. For example, in a prior art circuit comprising a single differential amplifier circuit, even though the differential amplifier is turned off, a sufficiently large noise signal may overcome the bias voltage keeping the differential amplifier off, thereby turning the differential amplifier on and providing a false output signal. By contrast, in the present cross-coupled differential amplifier circuit 10, as previously explained, in the normal state when both amplifiers are conducting, all input signals, including noise, will be rejected because of the symmetry and cancelling effect of the circuit 10. Furthermore, if one of the amplifiers 22, 22′ has been turned off, the circuit 10 will continue to reject high level noise and thereby prevent a false output signal. More specifically, if one of the differential amplifiers 22 or 22′ is turned off, and a very high-level noise signal occurs at the input terminals 12 or 14 and turn on the amplifier which is biased off, no false output signal will be produced at output terminals 24 and 26, because when both differential amplifiers are turned on, the cancelling effect of the circuit 10 assures that no net change in differential voltage will occur across terminals 24 and 26.

Another advantage of the present circuit over prior art circuits is that no time is required to permit an amplifier to come up to its normal gain as is required in the prior art. In the prior art, the single differential amplifier is normally kept off until a bipolar data input signal is expected, at which time the amplifier is turned on. However, an undesirably long time is required after the amplifier is switched on in order for it to reach its desired gain. By contrast, in the present invention, both amplifiers 22 and 22′ are normally conducting and on, and when it is desired to detect and amplify an input data signal, one amplifier is merely turned off, it being well recognized that the turnoff time of a transistor is much shorter than its turn-on time.

While the invention has been particularly shown and described with reference to a preferred embodiment thereof, it will be understood by those skilled in the art that various changes in form and details may be made therein without departing from the spirit and scope of the invention as defined in the following claims.

I claim:

1. A differential amplifier circuit comprising:

a. two differential amplifiers each having two input terminals for receiving a bipolar input signal, b. means cross-coupling the input terminals of said differential amplifiers, c. a pair of common output terminals connected to both of said differential amplifiers and adapted to be connected to a utilization device requiring a differential signal, d. means for normally biasing both of said amplifiers into conduction so that all differential and common mode input signals are normally rejected by said differential amplifier circuit, and e. means for selectively rendering nonconducting one of said differential amplifiers to permit said input signal to be amplified by the other differential amplifier, thereby producing a differential signal at said output terminals.

2. A differential amplifier circuit as defined in claim 1 further comprising means for selectively rendering nonconducting one or the other of said differential amplifiers in accordance with the input signal polarity relative to said two input terminals, whereby the polarity of the differential signal at said output terminals is independent of the signal polarity relative to said two input terminals.

3. A differential amplifier circuit comprising:

a. two differential amplifiers, each comprising:

1. first and second transistors each having an input electrode and two output electrodes, and 2. means connecting one pair of corresponding output electrodes of said transistors to a common point, b. a first output terminal connected to one pair of corresponding electrodes of said first and second differential amplifiers, c. a second output terminal connected to the other pair of corresponding output electrodes of said first and second differential amplifiers, d. means cross-coupling the input electrodes of sad first and second differential amplifiers, e. means for normally applying to said common point a bias voltage which normally renders both of said differential amplifiers conducting to reject any input signals applied to said input electrodes, and f. means for selectively rendering nonconducting one of said differential amplifiers to permit a differential output signal in the form of an amplified version of an input signal to appear at said first and second output terminals.

4. A differential amplifier circuit as defined in claim 3 wherein said means for selectively rendering nonconducting comprises means for varying the bias voltage applied to one of said common points.

5. A differential amplifier as defined in claim 3 further comprising means for selectively rendering nonconducting one or the other of said differential amplifiers so that the polarity of the output signal at said first and second output terminals is independent of the polarity of the input signal applied to the input of said differential amplifier circuit.

6. A differential amplifier as defined in claim 5 wherein said means for rendering nonconducting comprises transistor switching means for selectively applying an additional bias voltage to either of said common points.

7. A differential amplifier circuit as defined in claim 6 wherein said transistor switching means comprises:

a. a source of bias voltage, and b. a pair of transistors, each connected between said source and the different one of said common points.

8. A differential amplifier circuit as defined in claim 3 wherein all of said transistors are of the same conductivity type.

9. A differential amplifier circuit as defined in claim 7 wherein all of said transistors are of the same conductivity type.